(12) United States Patent
Higashi et al.

(10) Patent No.: US 7,537,987 B2
(45) Date of Patent: May 26, 2009

(54) SEMICONDUCTOR DEVICE MANUFACTURING METHOD

(75) Inventors: Masahiko Higashi, Tokyo (JP); Satoshi Kume, Tokyo (JP); Jiro Yugami, Tokyo (JP); Shinichi Yamanari, Tokyo (JP); Takahiro Maruyama, Tokyo (JP); Itaru Kanno, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 96 days.

(21) Appl. No.: 11/551,861

(22) Filed: Oct. 23, 2006

(65) Prior Publication Data

US 2007/0099406 A1    May 3, 2007

(30) Foreign Application Priority Data

Oct. 28, 2005   (JP)   ............... 2005-313635

(51) Int. Cl.
*H01L 21/84* (2006.01)

(52) U.S. Cl. .................. 438/197; 438/230; 438/257; 438/593; 438/738; 438/742; 257/E21.008; 257/E21.018; 257/E21.209; 257/E21.252; 257/E21.507; 257/E27.103; 257/E29.255

(58) Field of Classification Search ......... 438/238–256, 438/197, 593, 738, 742; 257/E21.008, 209, 257/252, 422, 507, 577, 585, E27.103, E29.255, 257/18

See application file for complete search history.

(56) References Cited

U.S. PATENT DOCUMENTS

| | | | | |
|---|---|---|---|---|
| 5,258,095 | A * | 11/1993 | Nagata et al. | 216/67 |
| 6,531,728 | B2 * | 3/2003 | DeBoer et al. | 257/306 |
| 2004/0266077 | A1 * | 12/2004 | Yeo et al. | 438/157 |
| 2006/0091428 | A1 * | 5/2006 | Yeo et al. | 257/213 |
| 2007/0152276 | A1 * | 7/2007 | Arnold et al. | 257/369 |
| 2007/0228458 | A1 * | 10/2007 | Henson et al. | 257/327 |
| 2007/0284670 | A1 * | 12/2007 | Yamamoto et al. | 257/369 |

FOREIGN PATENT DOCUMENTS

| | | |
|---|---|---|
| JP | 2005-72316 | 3/2005 |
| WO | WO 2004/095572 | 11/2004 |

* cited by examiner

*Primary Examiner*—Michael S Lebentritt
(74) *Attorney, Agent, or Firm*—Oblon, Spivak, McClelland, Maier & Neustadt, P.C.

(57) ABSTRACT

In a semiconductor device manufacturing method of the invention, a metal film, for forming a gate electrode, is formed on a gate insulating film. Subsequently, when the metal film is processed, part of the metal film is removed by a wet etching process using a given chemical liquid.

3 Claims, 10 Drawing Sheets

F I G . 7
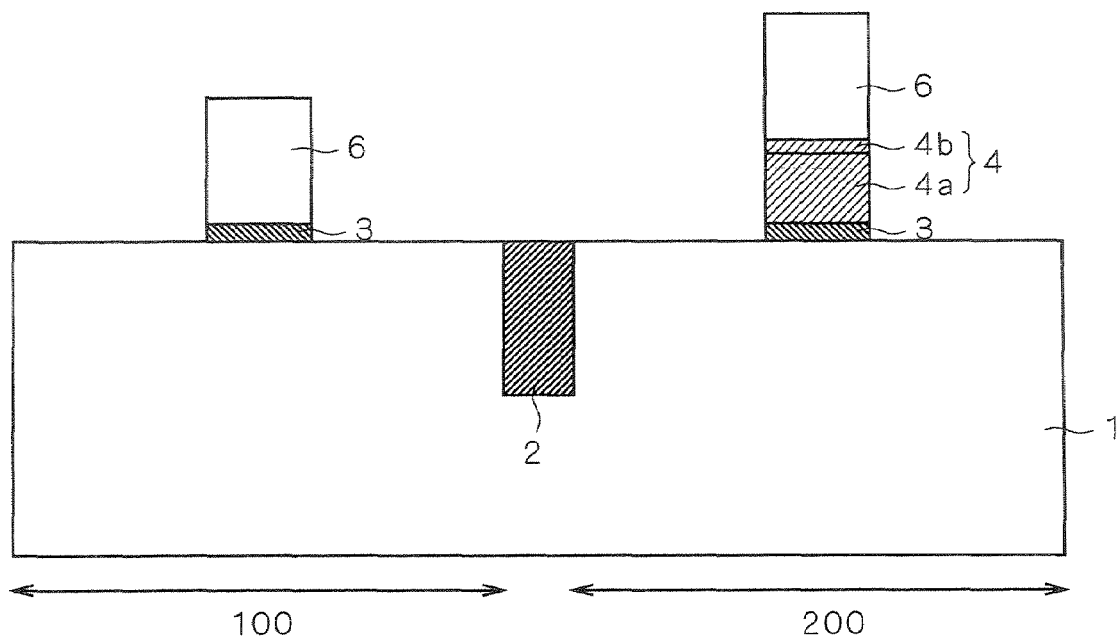
F I G . 8
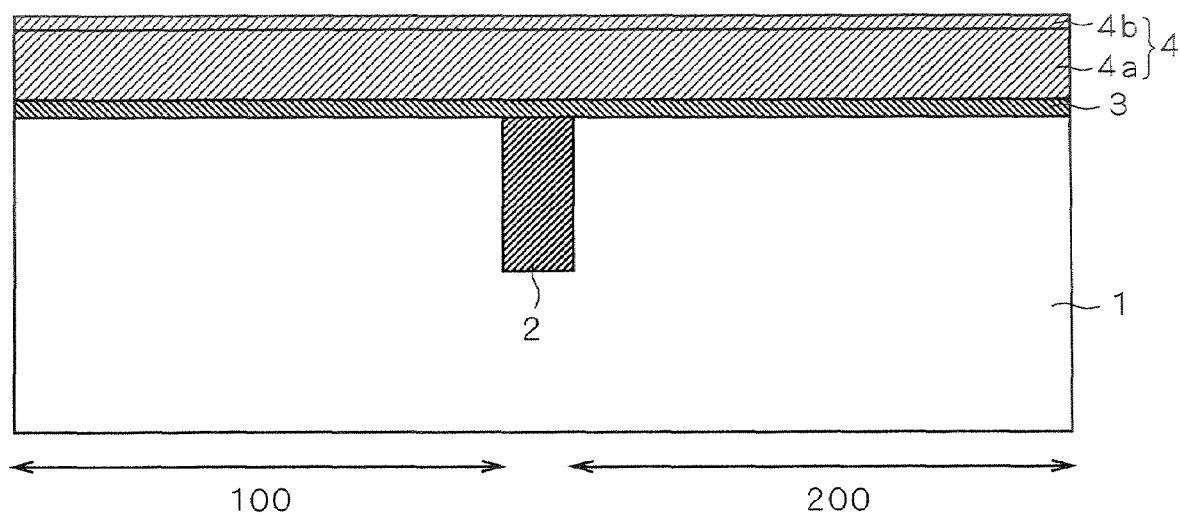

F I G . 1 1
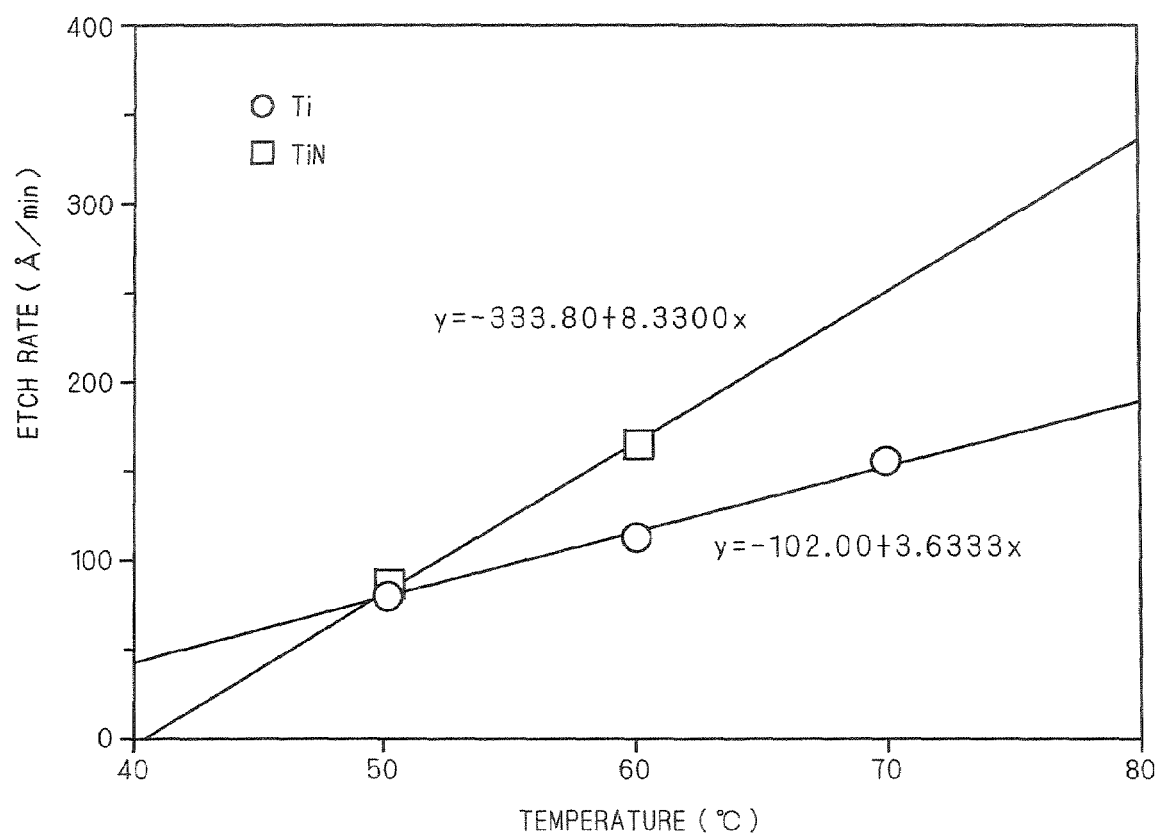

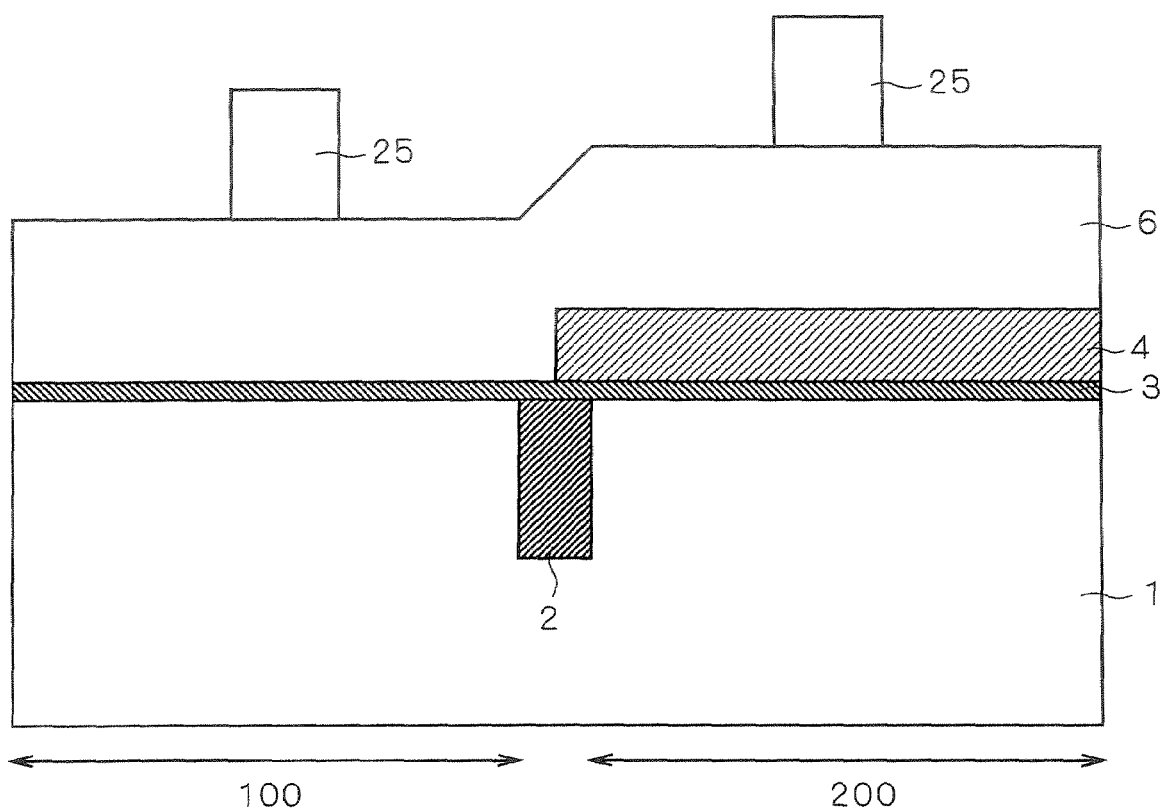
F I G . 1 3

SEMICONDUCTOR DEVICE MANUFACTURING METHOD

BACKGROUND OF THE INVENTION

1. Field of the Invention

The present invention relates to a semiconductor device manufacturing method, and particularly to a method of manufacturing a semiconductor device having a metal film formed on a gate insulating film.

2. Description of the Background Art

For the miniaturization of semiconductor devices, materials having high dielectric constants (High-k) are adopted to form gate insulating films. Also, there are semiconductor devices in which a metal film is provided on the gate insulating film so as to form gate electrodes. In methods of manufacturing semiconductor devices thus structured, dry etching is performed to partially remove the metal film (patterning).

After the dry etching, etching residues of the metal film remain. Accordingly, it is necessary to perform a cleaning process using, e.g., hydrogen fluoride, in order to remove the etching residues.

A technique for forming a metal film on a gate insulating film having a high dielectric constant is disclosed in Japanese Patent Application Laid-Open No. 2005-72316.

However, applying cleaning process after the dry etching reduces the thickness of the gate insulating film. The thickness of the gate insulating film is reduced also before or after the dry etching. However, the thickness of the gate insulating film is reduced more considerably during the cleaning.

It is thought that this is because the plasma generated during the dry etching damages the gate insulating film lying under the metal film to be removed, and the bonding of molecules of the gate insulating film is weakened in the damaged portions. The reduction of thickness may occur also when the gate insulating film is not a high-dielectric-constant film.

For example, when a cleaning process was performed for about 20 minutes after dry etching, reductions of thickness of about 8 nm to 9 nm (or more) on average were observed with high-dielectric-constant gate insulating films.

The thickness reduction of gate insulating films causes variations of leakage current in the transistors and increases the value of leakage current (that is, it causes deteriorations of electric characteristics of the manufactured transistors). It is therefore desirable to suppress the reduction of thickness of gate insulating films.

SUMMARY OF THE INVENTION

An object of the present invention is to provide a semiconductor device manufacturing method that is capable of suppressing a reduction of the thickness of an insulating film formed under a metal film when the metal film undergoes processing.

According to the present invention, a semiconductor device manufacturing method includes the steps (A) to (C). The step (A) forms a gate insulating film on a semiconductor substrate. The step (B) forms a metal film which forms a gate electrode on the gate insulating film. The step (C) removes part of the metal film by a wet etching process using a given chemical liquid.

The gate insulating film is not damaged, while it will be damaged when a dry etching is applied to the metal film. This suppresses a reduction of the thickness of the gate insulating film.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a cross-sectional view showing an example in which the metal film is formed as a stacked film;

FIGS. 8 and 9 are cross-sectional views for describing process steps of the semiconductor device manufacturing method according to a second preferred embodiment;

FIG. 11 is a diagram showing experimental results about a relation between etch rates and temperature;

FIGS. 13 to 16 are cross-sectional views for describing process steps of the semiconductor device manufacturing method according to a third preferred embodiment.

DESCRIPTION OF THE PREFERRED EMBODIMENTS

Figure 1:
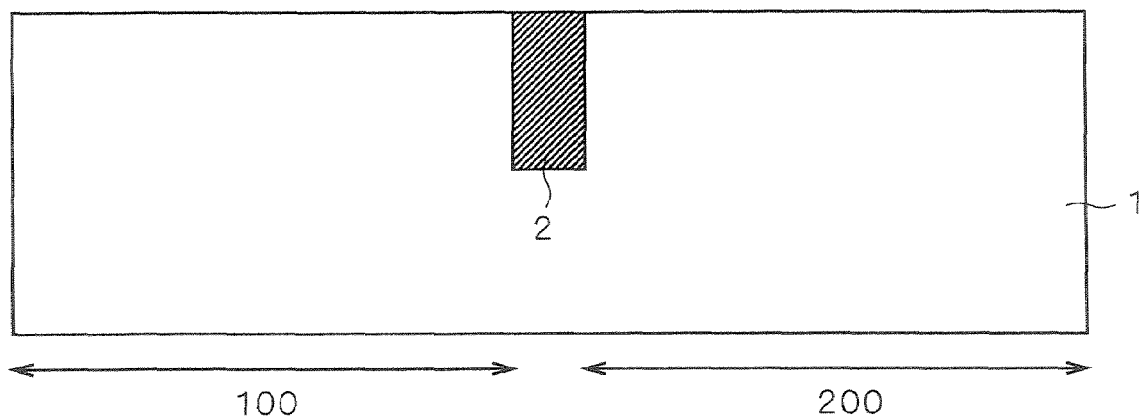
FIGS. 1 to 6 are cross-sectional views for describing process steps of the semiconductor device manufacturing method according to a first preferred embodiment.

The present invention will now be specifically described referring to the drawings illustrating the preferred embodiments.

First Preferred Embodiment

A semiconductor device manufacturing method according to a preferred embodiment is described referring to the cross-sectional views showing the process steps. The description below explains an application of the present invention to a method of manufacturing a semiconductor device in which n-FET (n-type field-effect transistors) and p-FET (p-type field-effect transistors) are fabricated in a same semiconductor substrate.

First, a semiconductor substrate 1 is prepared which has an n-FET formation region 100 and a p-FET formation region 200. Now, as shown in FIG. 1, the n-FET formation region 100 and the p-FET formation region 200 are electrically isolated by an element isolation film (STI film) 2. Though not shown in FIG. 1, well regions of given conductivity types and active regions of given conductivity types are formed in the semiconductor substrate 1.

Figure 2:
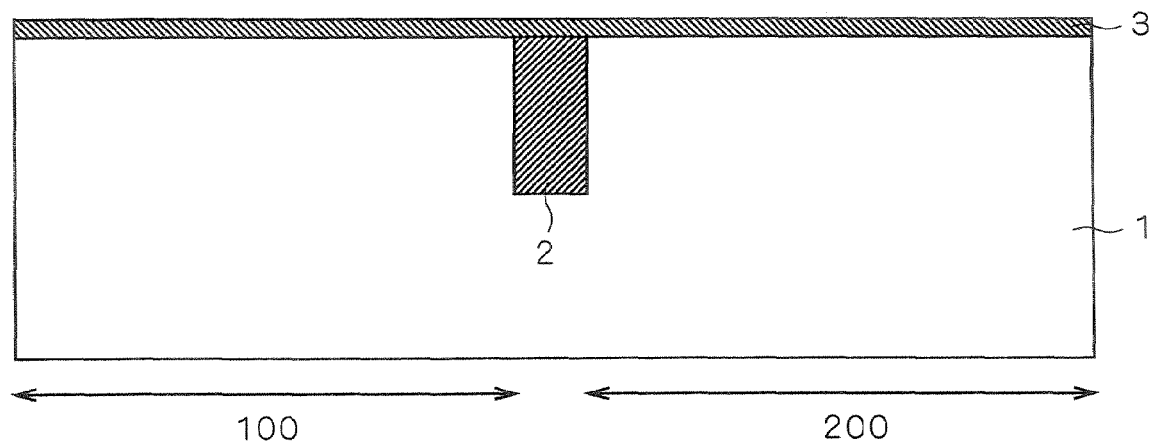

Next, as shown in FIG. 2, a gate insulating film 3 having a high dielectric constant (High-k) is formed on the semiconductor substrate 1. The gate insulating film 3 can be formed by CVD (Chemical Vapor Deposition), for example. The high-dielectric-constant gate insulating film 3 may be formed of HfSiON (dielectric constant: 10 to 15), $HfO_2$ (dielectric constant: around 24), or $La_2O_3$ (dielectric constant: around 27).

Figure 3:
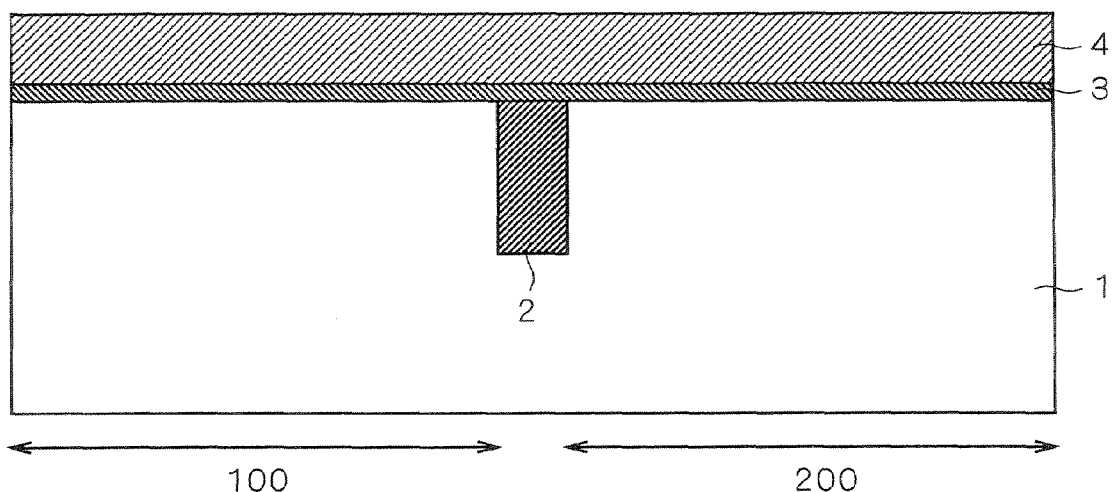

Next, as shown in FIG. 3, a metal film 4 is formed on the gate insulating film 3, for the purpose of forming a gate electrode. The metal film 4 can be formed by CVD, for example. The metal film 4 may be a film of metal other than Al. For example, the metal film 4 may be a single-layer film of TiN, Ru, RuO, TaN, HfN, Ni, Re, Ir, Pt, or WN, or a stacked film including TiN and Ti films stacked in this order, or a stacked film including WN and WSi films stacked in this order.

Figure 4:
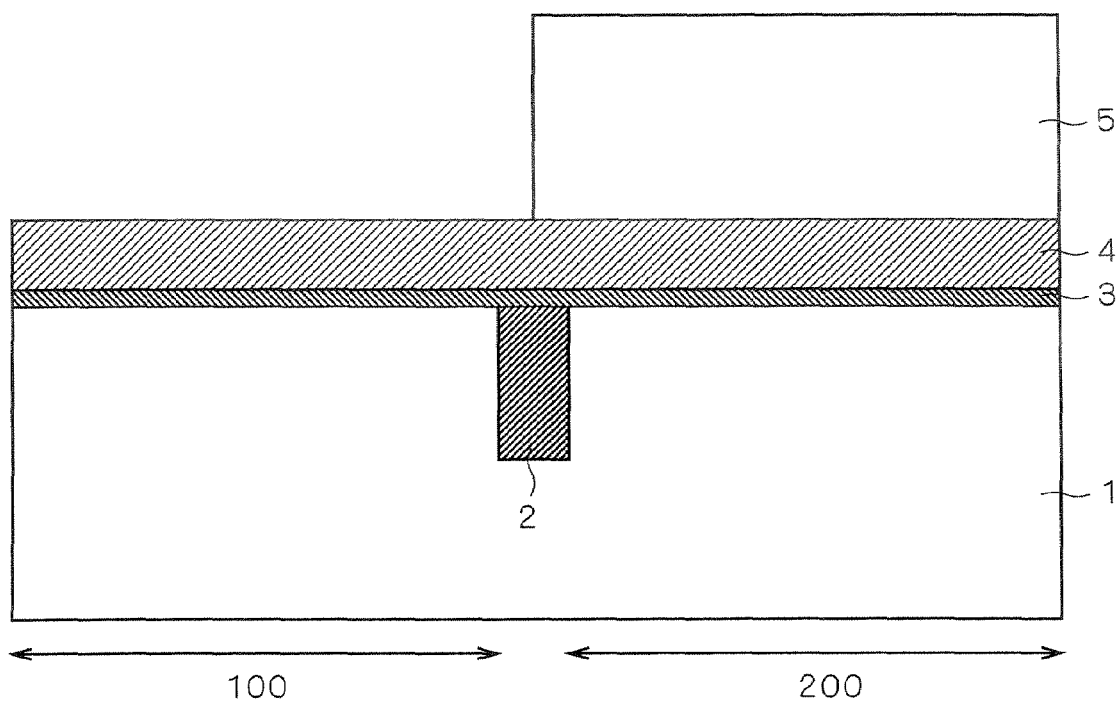

Next, as shown in FIG. 4, a resist 5 is formed in a given shape on the metal film 4. The resist 5 is used as a mask in a wet etching process performed later. Accordingly, the resist 5 is formed in a given shape such that unwanted portions of the metal film 4 can be removed (in this example, the portion of the metal film 4 that resides in the n-FET region 100 is removed).

Figure 5:
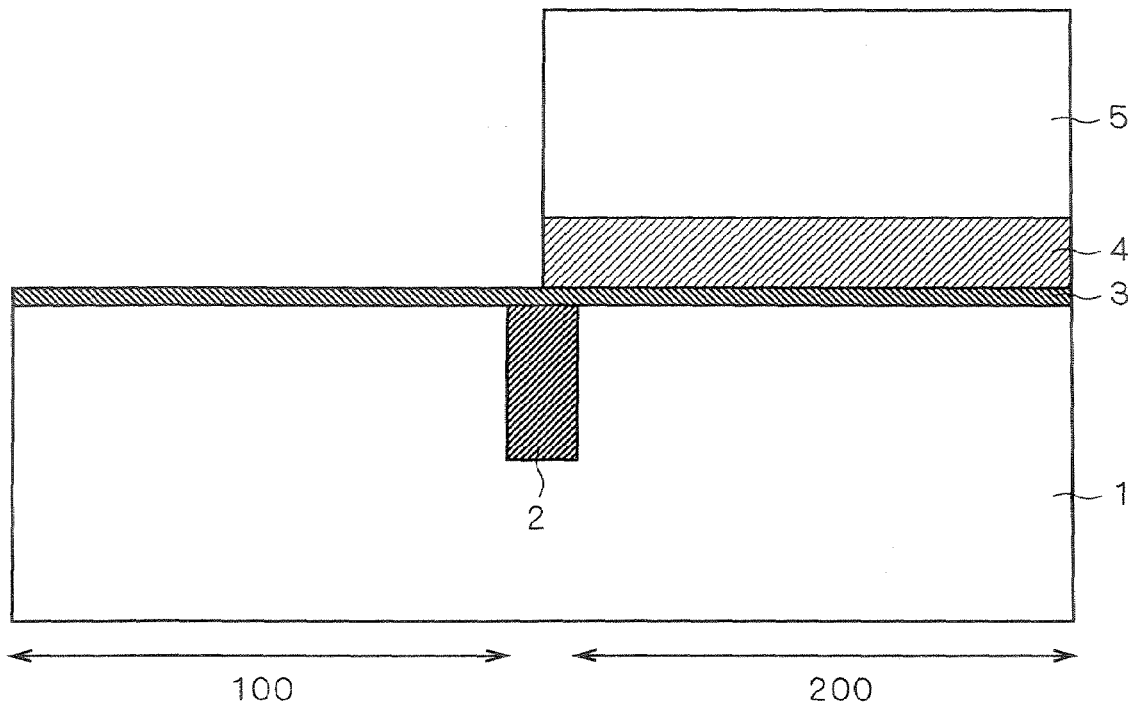

Next, using the resist 5 as a mask, a wet etching process is carried out using a given chemical liquid. Then, as shown in FIG. 5, the portion of the metal film 4 (the portion of the metal film 4 that resides in the n-FET formation region 100) is etched away (removed). In other words, the metal film 4 is left only in the p-FET formation region 200.

As compared with dry etching, wet etching leaves less etching residues of the metal film 4. Accordingly, it is not essential to perform a cleaning process for removing etching residues.

As for the given chemical liquid, it is desirable to use one that satisfies the conditions below. That is, the desirable conditions are: higher selectivity with respect to the resist; no damage (or less damage) to the high-dielectric-constant gate insulating film 3; and a higher etch rate to the metal film 4.

Chemical liquids that satisfy these conditions are liquids that at least contain acid. Accordingly, it is more desirable to use, as the given chemical liquid, hydrogen peroxide solution, mixed acid (mixed liquid of acids of two or more kinds, such as a mixed liquid of phosphoric acid, nitric acid, acetic acid, and water), hydrogen peroxide solution+ aqueous ammonia, or hydrogen peroxide solution+ mixed acid, for example. Appropriate temperatures for the given chemical liquids are from 23° C. to 80° C.

The wet etching process is conducted in an apparatus of dip type, spray type, or single wafer processing type, for example.

Next, the resist 5 is removed and a polysilicon film 6 is formed over the semiconductor substrate 1 to cover the gate insulating film 3 and the metal film 4. Subsequently, the polysilicon film 6, the metal film 4, and the gate insulating film 3 are patterned into a given shape.

Figure 6:
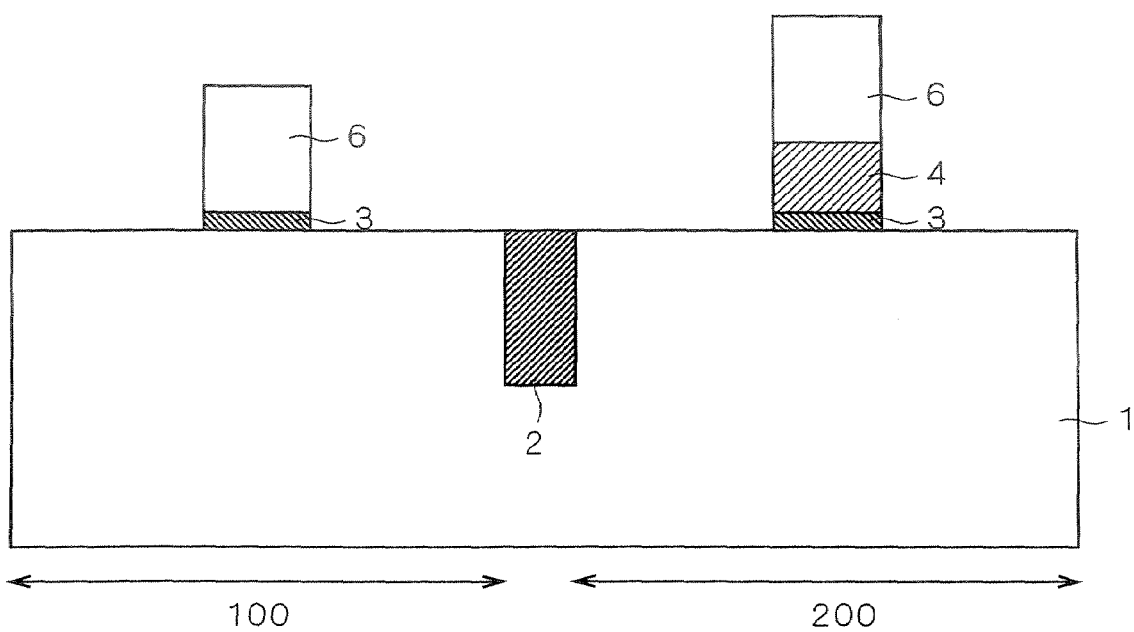

Thus, as shown in FIG. 6, the gate insulating film 3 and the polysilicon film 6 stacked in this order in the n-FET formation region 100 form a gate structure on the semiconductor substrate 1. Also, in the p-FET formation region 200, the gate insulating film 3, the metal film 4, and the polysilicon film 6 stacked in this order form a gate structure on the semiconductor substrate.

In the n-FET formation region 100, the gate electrode is made only of the polysilicon film 6, and the gate electrode in the p-FET formation region 200 is made of the metal film 4 and the polysilicon film 6.

Thus, in the semiconductor device manufacturing method of this preferred embodiment, wet etching is applied to the n-FET formation region 100 during the formation of the metal film 4.

Unlike dry etching, wet etching does not involve generation of plasma. That is, adopting wet etching reduces the damage to the high-dielectric-constant gate insulating film 3 lying under the metal film 4 to be etched (removed).

Accordingly, even when a cleaning process, for example, is applied to the semiconductor substrate 1 as a post-treatment, the thickness reduction of the gate insulating film 3 in the n-FET formation region 100 is suppressed. This prevents variation and increase of leakage current in the n-FET.

As compared with the process of dry etching, the process of wet etching itself causes less thickness reduction of the gate insulating film 3. Also, unlike dry etching, wet etching causes almost no etching residue of the metal film 4. Accordingly, adopting the manufacturing method of this preferred embodiment removes the need for a cleaning process for removing etching residues.

Also, when a chemical liquid at least containing acid (any of the chemicals cited above) is used as the given chemical liquid for the wet etching, the damage to the high-dielectric-constant gate insulating film 3 is further reduced, and the etch rate to the metal film 4 is enhanced.

The inventors and others made metal films on high-dielectric-constant insulating films and applied wet etching to the metal films to verify the effects of the invention.

The high-dielectric-constant insulating films were made of HfSiON, with film thicknesses of 1 nm to 5 mm. The high-dielectric-constant insulating films were annealed at about 1000° C. for stabilization. The metal films were made of TiN, with thicknesses of 5 nm or more.

The wet etching was conducted in a dip-type processing apparatus using a mixed acid (phosphoric acid:nitric acid: acetic acid:water=40:1:2:3 by volume) as the chemical liquid (the temperature of the chemical was 65° C.).

Then, the TiN (metal film) was etched about 8.5 nm in five minutes on average. The amount of etch increased as the etching time was increased, and the film was etched about 27.3 nm in 20 minutes on average. These results indicate that performing wet etching with the chemical liquid mentioned above offers an enhanced etch rate to TiN (metal film).

On the other hand, the HfSiON (high-dielectric-constant insulating film) was etched only about 0.1 nm in three minutes on average. The amount of etch just slightly increased even when the etching time was increased, and the film was etched only about 0.3 nm in 20 minutes on average. The results show that performing wet etching with the chemical liquid mentioned above hardly reduces the thickness of the HfSiON (high-dielectric-constant insulating film).

Also, as mentioned earlier, the wet etching, unlike dry etching, does not require generation of plasma, and it therefore causes almost no damage (i.e., almost no deterioration of the bonding of molecules) to the HfSiON (high-dielectric-constant insulating film). Accordingly, the thickness of the HfSiON (high-dielectric-constant insulating film) is not reduced even when a cleaning process or the like is applied after the wet etching (this was also experimentally verified).

Also, unlike dry etching, wet etching causes almost no etching residues, and therefore the cleaning process may be omitted.

In this preferred embodiment, the metal film 4 of the example is formed as a single-layer film, but it may be formed as a stacked film including a TiN film (or a WN film) 4a and a Ti film (or a WSi film) 4b stacked in this order (see FIG. 7). As shown in FIG. 7, placing the Ti film (or WSi film) 4b between the TiN film (or WN film) 4a and the polysilicon film 6 reduces the interface resistance between the TiN film (or WN film) 4a and the polysilicon film 6.

When the metal film 4 is formed as a stacked film including the TiN film 4a and the Ti film 4b stacked in this order, the stacked film can be removed by wet etching using a hydrogen peroxide solution, for example.

Also, when the metal film 4 is a stacked film including a WN film 4a and a WSi film 4b stacked in this order, the stacked film can be removed by wet etching using a mixture of aqueous ammonia and hydrogen peroxide solution, for example (removal of the metal film 4 with one kind of chemical liquid). Alternatively, for example, the WSi film 4b may be removed by wet etching using a mixture of aqueous ammonia and hydrogen peroxide solution, and the WN film 4a may be removed by wet etching using a hydrogen peroxide solution or mixed acid (for example, a mixture of phosphoric acid, nitric acid, acetic acid and water) (removal of the metal film 4 with two kinds of chemical liquids).

As can be seen from FIG. 7, the gate electrode in the n-FET formation region 100 is formed only of the polysilicon film 6, and the gate electrode in the p-FET formation region 200 is formed of the TiN film (or WN film) 4a, the Ti film (or WSi film) 4b, and the polysilicon film 6.

Second Preferred Embodiment

The first preferred embodiment has shown an example in which the metal film 4 is formed as a stacked film including a TiN film 4a and a Ti film 4b stacked in this order (see FIG. 7). Now, a method of manufacturing a semiconductor device will be described in which the stacked film of TiN film 4a and Ti film 4b is adopted as the metal film 4.

First, the structure shown in FIG. 3 is obtained as explained referring to FIGS. 1 to 3. In this preferred embodiment, the metal film 4 shown in FIG. 3 is the TiN film 4a.

Next, as shown in FIG. 8, the Ti film 4b is formed on the TiN film 4a so that the Ti film 4b can form a gate electrode together with the TiN film 4a. The Ti film 4b can be formed by CVD, for example.

Figure 9:
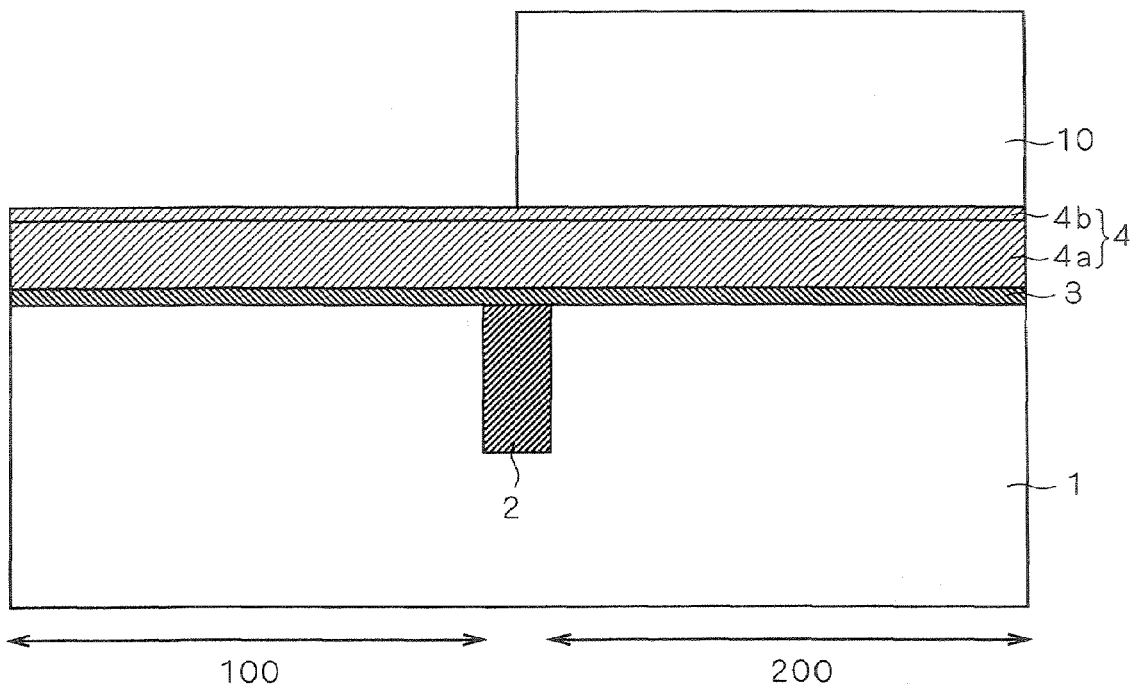

Next, as shown in FIG. 9, a resist 10 is formed in a given shape on the Ti film 4b. The resist 10 is used as a mask in a wet etching process performed later. Accordingly, the resist 10 is formed in a given shape such that unwanted portions of the TiN film 4a and the Ti film 4b can be removed (in this preferred embodiment, the portion of the TiN film 4a and the Ti film 4b that resides in the n-FET region 100 is removed).

Next, using the resist 10 as a mask, a wet etching process is performed using a given chemical liquid.

Now, suppose that the wet etching to the metal film 4 including the TiN film 4a and the Ti film 4b is carried out as described in the first preferred embodiment. In this case, it is possible to remove the TiN film 4a and the Ti film 4b from the n-FET formation region 100 without reducing the thickness of the gate insulating film 3.

Figure 10:
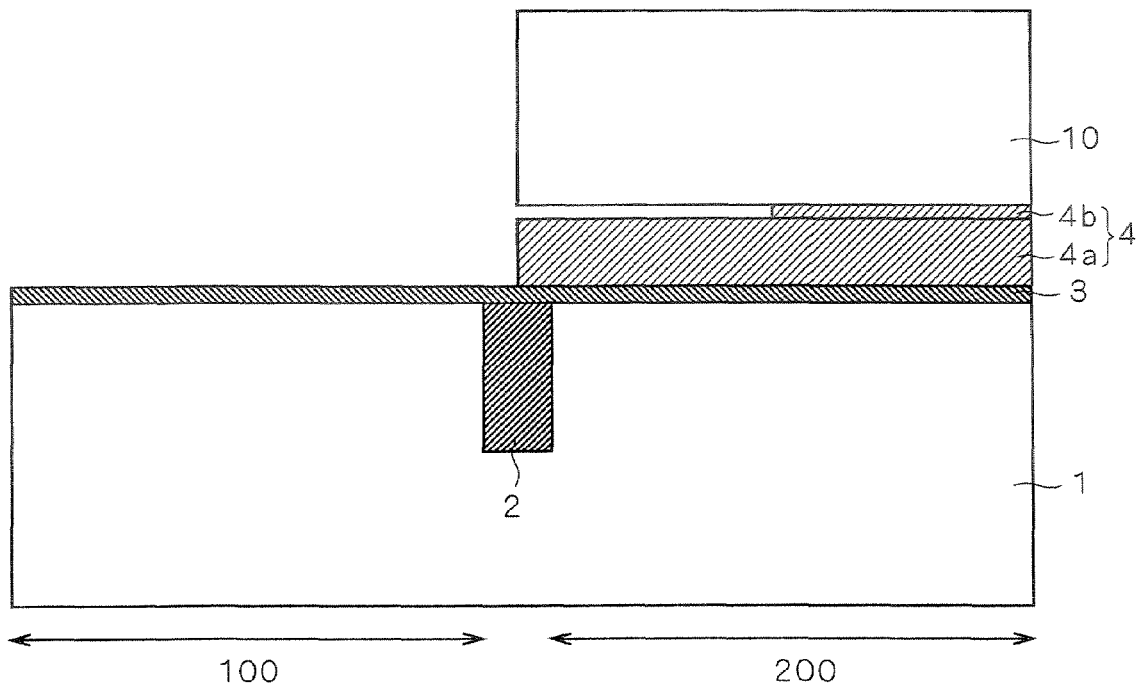
FIG. 10 is a cross-sectional view of a process step for describing a problem of the semiconductor device manufacturing method.

However, as shown in FIG. 10, when the rate of wet etching to the Ti film 4b is larger than the rate of wet etching to the TiN film 4a, the Ti film 4b is over-etched in horizontal direction in the diagram. In order to prevent the over-etching, it is necessary to perform the wet etching in such a way that the etch rate to the Ti film 4b is smaller than the etch rate to the TiN film 4a.

The inventors and others examined conditions for the wet etching, and obtained the experimental data shown in FIG. 11. FIG. 11 shows experimental results about a relation between the temperature of the chemical liquid (hydrogen peroxide solution) used for the wet etching and the etch rates to the TiN film 4a and the Ti film 4b that the chemical liquid exhibited.

In FIG. 11, the horizontal axis shows the temperature (° C.) of the hydrogen peroxide solution. The vertical axis shows the etch rates (Å/min). The square marks show data about the TiN film 4a, and the circular marks show data about the Ti film 4b.

FIG. 11 shows two approximate lines. One is an approximate line about the data on the TiN film 4a ($y=-333.80+8.33x$), and the other is an approximate line about data on the Ti film 4b ($y=-102+3.6333x$).

As can be seen from FIG. 11, the etch rate to the Ti film 4b is smaller than the etch rate to the TiN film 4a when the wet etching is conducted with a hydrogen peroxide solution at temperatures of 50° C. or higher.

Accordingly, in this preferred embodiment, the wet etching for removing the TiN film 4a and the Ti film 4b uses a hydrogen peroxide solution as the given chemical liquid at a temperature of 50° C. or higher.

Figure 12:
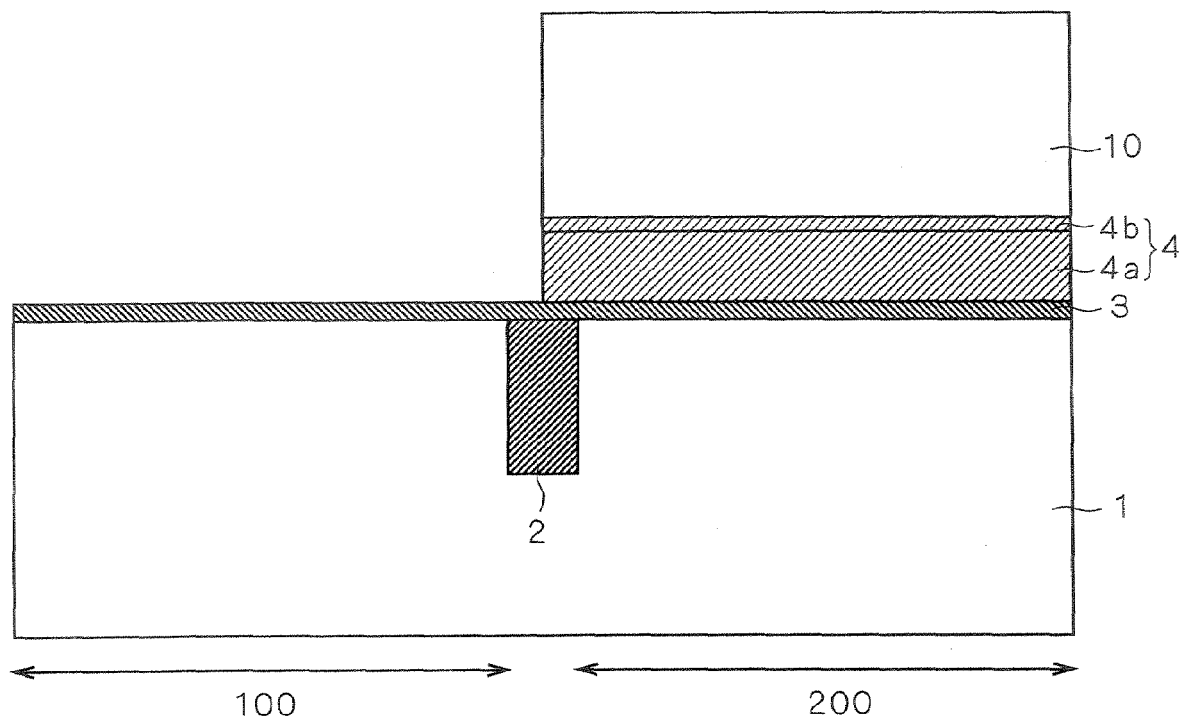
FIG. 12 is a cross-sectional view for describing a process step of the semiconductor device manufacturing method of the second preferred embodiment.

As shown in FIG. 12, the wet etching using the given chemical liquid etches away (removes) part of the TiN film 4a and part of the Ti film 4b (the part of the TiN film 4a and the Ti film 4b that is formed in the n-FET formation region 100) without causing horizontal over-etch of the Ti film 4b in the p-FET formation region 200 (hereinafter, this condition is referred to as "desirably shaped"). In other words, it is possible to cause the metal film 4 to remain only in the p-FET formation region 200, with the Ti film 4b desirably shaped.

As described in the first preferred embodiment, the gate insulating film 3 in the n-FET formation region 100 is not damaged because wet etching is adopted. Also, almost no etching residue is left.

Next, the resist 10 is removed, and the polysilicon film 6 is formed over the semiconductor substrate 1 to cover the gate insulating film 3 and the metal film 4. Subsequently, the polysilicon film 6, the metal film 4, and the gate insulating film 3 are patterned into a given shape.

The structure shown in FIG. 7 is thus obtained.

Thus, in the semiconductor device manufacturing method of this preferred embodiment, a stacked film including the TiN film 4a and the Ti film 4b stacked in this order is adopted as the metal film 4. Accordingly, when the polysilicon film 6 is formed on the Ti film 4b, the contact resistance between the TiN film 4a and the polysilicon film 6 is reduced.

The wet etching to the stacked metal film 4 uses a hydrogen peroxide solution as the given chemical liquid at a temperature of 50° C. or higher. This allows the metal film 4 to be left only in the p-FET formation region 200, with the Ti film 4b shaped desirably. Also, adopting wet etching keeps the gate insulating film 3 undamaged in the n-FET formation region 100, as described in the first preferred embodiment. Furthermore, almost no etching residue is left.

Third Preferred Embodiment

The semiconductor device manufacturing method of this preferred embodiment relates to the process from the structure shown in FIG. 5 to the structure shown in FIG. 6 of the first preferred embodiment.

In this process, the resist 5 is removed from the structure of FIG. 5, and the polysilicon film 6 is formed over the semiconductor substrate 1 to cover the metal film 4 and the gate insulating film 3 (see FIG. 13). Then, a resist 25 is formed in a given shape on the polysilicon film 6 (see FIG. 13).

Next, in order to form gate structures, the polysilicon film 6, the metal film 4, and the gate insulating film 3 are etched by using the resist 25 as a mask. Suppose that this etching is done only by dry etching.

In this case, as can be seen from FIG. 13, the upper surface of the polysilicon film 6 has a difference in level between the n-FET formation region 100 and the p-FET formation region 200. Accordingly, when the dry etching to the polysilicon film 6 finishes, dry etching to the gate insulating film 3 starts in the n-FET formation region 100, while dry etching to the metal film 4 and the gate insulating film 3 starts in the p-FET formation region 200.

Therefore, in the n-FET formation region 100, the semiconductor substrate 1 is exposed by the time when the dry etching to the gate insulating film 3 in the p-FET formation region 200 ends. That is, the portion in the vicinity of the upper surface of the semiconductor substrate 1 in the n-FET formation region 100 is damaged by the dry etching for a longer period of time. The damage to the semiconductor substrate 1 deteriorates performance of the completed transistors.

Accordingly, in this preferred embodiment, the following procedure is carried out during the formation of gate structures.

Figure 14:
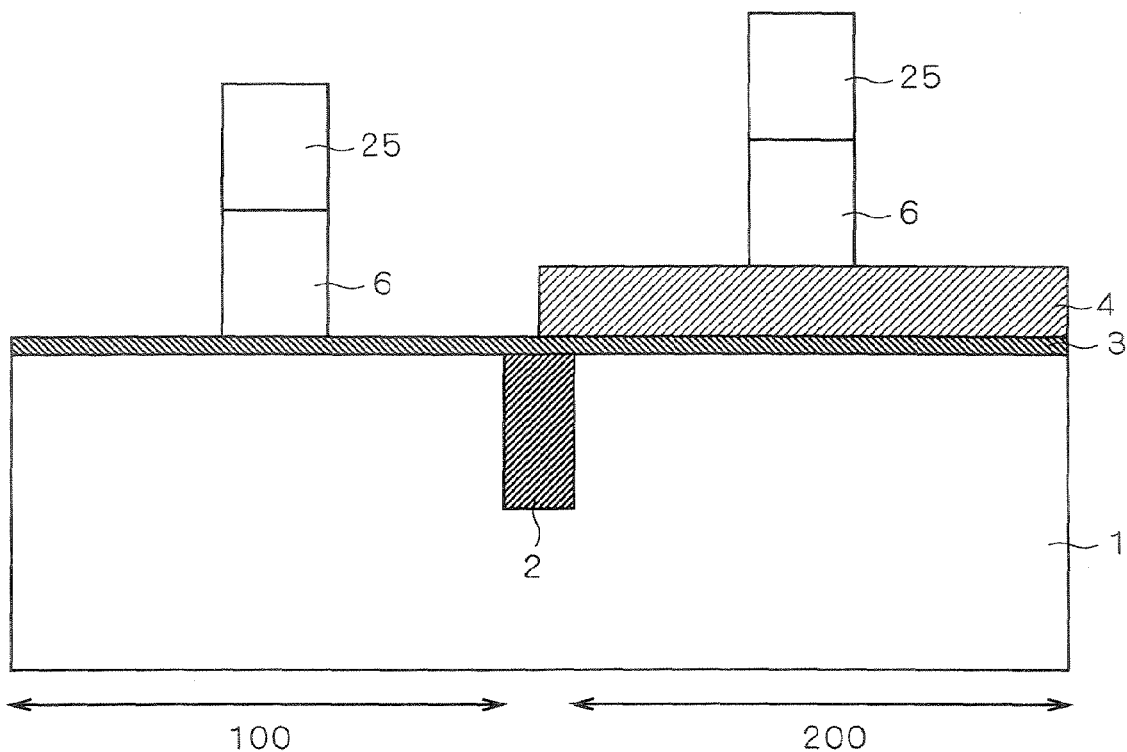

First, in the condition shown in FIG. 13, a dry etching process is performed using the resist 25 as a mask. Then, as shown in FIG. 14, this dry etching is ended when the metal film 4 is exposed (reached) in the p-FET formation region 200. The timing for ending the dry etching can be determined by using end point techniques, for example.

Figure 15:
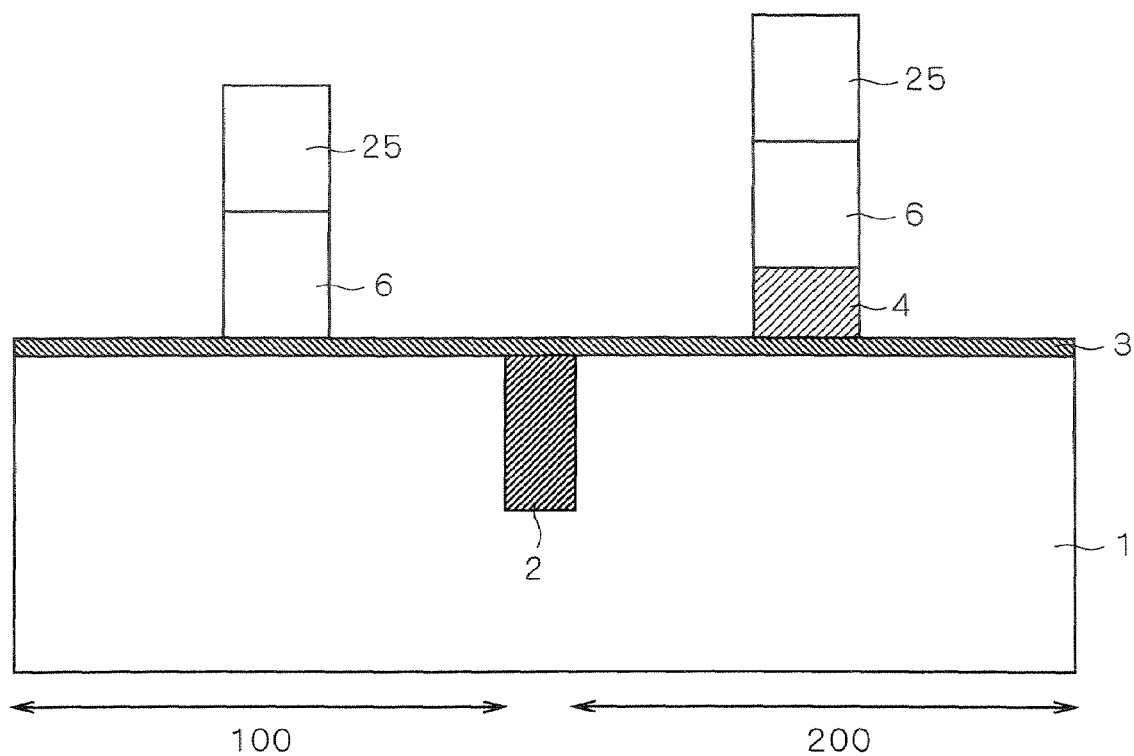

Next, using the resist 25 as a mask, a wet etching process is applied to the metal film 4. FIG. 15 shows the structure obtained after the wet etching of the metal film 4. This wet etching process is conducted using any of the given chemical liquids explained in the first preferred embodiment. As described in the first preferred embodiment, wet etching using the given chemical liquids hardly etches the gate insulating film 3.

After the wet etching of the metal film 4, the gate insulating film 3 is removed in the n-FET formation region 100 and the p-FET formation region 200, using the resist 25 as a mask.

Figure 16:
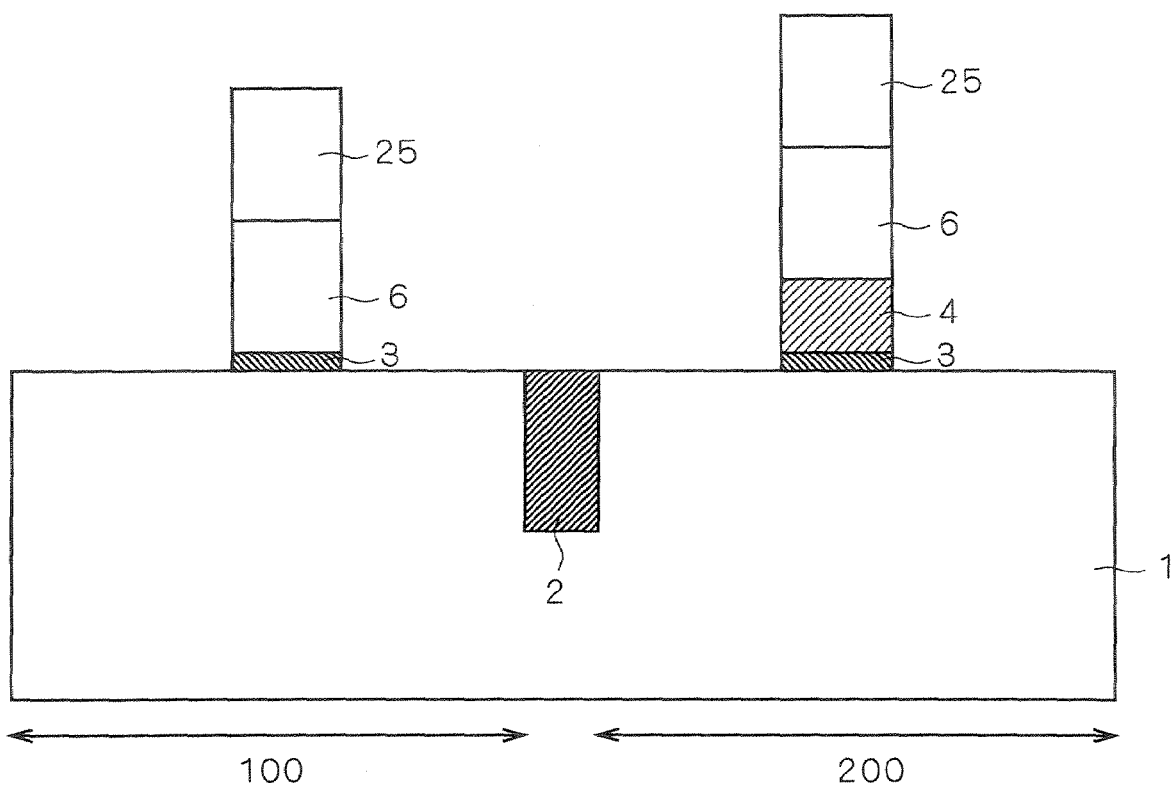

The gate insulating film 3 can be removed by wet etching, for example. FIG. 16 shows the structure obtained after the removal of the gate insulating film 3. The structure of FIG. 6 is obtained by removing the resist 25. Now, if the gate insulating film 3 is removed by dry etching, the upper surface of the semiconductor substrate 1 is damaged. It is therefore preferable to remove the gate insulating film 3 by wet etching.

As described above, in the semiconductor device manufacturing method of this preferred embodiment, dry etching is applied to the polysilicon film 6 and wet etching is applied to the metal film 4.

This prevents the damage to the portion in the vicinity of the upper surface of the semiconductor substrate 1 in the n-FET formation region 100 which would be caused if the polysilicon film 6 and the metal film 4 are processed by dry etching.

Needless to say, the semiconductor device manufacturing method of this preferred embodiment is applicable also to structures in which the metal film 4 is a stacked film including a TiN film and a Ti film stacked in this order, or a stacked film including a WN film and a WSi film stacked in this order, for example.

Now, when a stacked film including a TiN film and a Ti film stacked in this order is adopted as the metal film 4, it is preferable, as described in the second preferred embodiment, to adopt a hydrogen peroxide solution at a temperature of 50° C. or higher as the given chemical liquid for wet-etching the stacked film. Adopting the given chemical liquid suppresses horizontal over-etching of the Ti film.

Also, when a stacked film including a WN film and a WSi film stacked in this order (i.e., a stacked film in which a first metal film and a second metal film that at least contains silicon are stacked in this order) is adopted as the metal film 4, it is preferable to adopt the procedure below.

First, a dry etching is applied to the polysilicon film 6 and the WSi film (second metal film). The dry etching is stopped at the time when the dry etching reaches the WN film (first metal film). This dry etching removes part of the polysilicon film 6 and part of the WSi film (second metal film). Next, a wet etching is performed to remove part of the WN film (first metal film).

If wet etching is applied also to the WSi film (second metal film), the polysilicon film forming the gate electrode in the n-FET formation region 100 is shaved (thinned) in horizontal direction. That is, because the given chemical liquid is selected to remove the silicon-containing film, the chemical liquid also wet-etches the polysilicon in horizontal direction.

The horizontal thinning of the polysilicon film 6 forming the gate electrode is avoided by adopting the process of dry-etching such WSi film (second metal film) et al. and wet-etching only the WN film (first metal film).

The preferred embodiments described above adopt high-dielectric-constant material for the gate insulating film 3, considering miniaturization of the semiconductor device. However, the material of the gate insulating film 3 is not restricted by this example, but the present invention is effective also in methods of manufacturing semiconductor devices in which the gate insulating film 3 is made of material having a low dielectric constant.

The preferred embodiments have described an application of the present invention to a method of manufacturing a semiconductor device having the n-FET formation region 100 and the p-FET formation region 200. However, needless to say, the present invention is applicable to methods of manufacturing any semiconductor devices in which a metal film for a gate electrode is formed on a gate insulating film.

While the invention has been described in detail, the foregoing description is in all aspects illustrative and not restrictive. It is understood that numerous other modifications and variations can be devised without departing from the scope of the invention.

What is claimed is:

1. A semiconductor device manufacturing method, Comprising the steps of:
   (A) forming a gate insulating film on a semiconductor substrate having an n-FET formation region and a p-FET formation region;
   (B) forming a metal film which forms a gate electrode on said gate Insulating film; and
   (C) removing said metal film, while retaining said gate insulating film in said n-FET formation region by a wet etching process using a chemical liquid comprising one selected from the group consisting of a hydrogen peroxied solution, a mixed acid, a hydrogen peroxide and aqueous ammonia, and a hydrogen peroxide solution and mixed acid; further comprising the steps of:
   (D) after said step (C), forming a polysilicon film over said semiconductor substrate to cover said gate insulating film and said metal film;
   (E) applying a dry etching process to said polysilicon film to remove part of said polysilicon film, and stopping the dry etching process when the dry etching reaches said metal film; and
   (F) applying a wet etching process using said given chemical liquid to remove part of said metal film that resides in said p-FET formation region.

2. The semiconductor device manufacturing method according to claim 1, wherein said step (B) is a step of forming said metal film as a stacked film in which a first metal film and a second metal film that at least contains silicon are stacked in this order,
   said step (E) is a step of applying the dry etching process to said polysilicon film and said second metal film to remove part of said polysilicon film and part of said second metal film, and stopping the dry etching process when the dry etching reaches said first metal film, and
   said step (F) is a step of removing part of said first metal film by said wet etching process.

3. The semiconductor device manufacturing method according to claim 1,
   wherein said step (B) is a step of forming said metal film as a stacked film in which TiN and Ti are stacked in this order, and
   said step (C) is a step that uses a hydrogen peroxide solution at a temperature of 50° C. or higher as said chemical liquid.

* * * * *